US012587196B2

(12) United States Patent
Janaswamy et al.

(10) Patent No.: US 12,587,196 B2
(45) Date of Patent: Mar. 24, 2026

(54) THIN OXIDE LOW VOLTAGE TO HIGH VOLTAGE LEVEL SHIFTERS

(71) Applicant: XILINX, INC., San Jose, CA (US)

(72) Inventors: Lakshmi Venkata Satya Lalitha Indumathi Janaswamy, Hyderabad (IN); Narendra Kumar Pulipati, Hyderabad (IN); Shidong Zhou, Hyderabad (IN); Anil Kumar Kandala, Hyderabad (IN); Santosh Yachareni, Hyderabad (IN); Sree Rama Krishna Chaithnya Saraswatula, Hyderabad (IN)

(73) Assignee: XILINX, INC., San Jose, CA (US)

( * ) Notice: Subject to any disclaimer, the term of this patent is extended or adjusted under 35 U.S.C. 154(b) by 141 days.

(21) Appl. No.: 18/229,152

(22) Filed: Aug. 1, 2023

(65) Prior Publication Data

US 2025/0047285 A1 Feb. 6, 2025

(51) Int. Cl.
H03K 19/0185 (2006.01)
H03K 3/037 (2006.01)

(52) U.S. Cl.
CPC ..... H03K 19/018528 (2013.01); H03K 3/037 (2013.01); H03K 19/018521 (2013.01)

(58) Field of Classification Search
CPC ................................ H03K 19/018514–018528
See application file for complete search history.

(56) References Cited

U.S. PATENT DOCUMENTS

| | | | | | |
|---|---|---|---|---|---|
| 5,821,800 A | * | 10/1998 | Le | ......................... | H03K 17/102 |
| | | | | | 327/437 |
| 6,099,100 A | * | 8/2000 | Lee | ..................... | H03K 17/102 |
| | | | | | 326/83 |
| 6,487,687 B1 | * | 11/2002 | Blake | ............... | H03K 17/08142 |
| | | | | | 714/724 |
| 7,919,983 B1 | * | 4/2011 | Rana | .............. | H03K 19/018528 |
| | | | | | 326/68 |
| 9,755,621 B1 | * | 9/2017 | Sinha | ............... | H03K 3/356113 |
| 2005/0134355 A1 | * | 6/2005 | Maede | ............. | H03K 3/356113 |
| | | | | | 327/333 |
| 2010/0061164 A1 | * | 3/2010 | Tandon | ................... | G11C 5/147 |
| | | | | | 365/189.11 |
| 2010/0127752 A1 | * | 5/2010 | Fort | ................. | H03K 3/356113 |
| | | | | | 327/333 |

(Continued)

*Primary Examiner* — Patrick O Neill

(74) *Attorney, Agent, or Firm* — Patterson + Sheridan, LLP

(57) ABSTRACT

A level shifter may include a first transistor stack including at least four transistors arranged from a first voltage source to ground, including second and third transistors coupled with bias voltage source, and a fourth transistor coupled with an input to receive an input signal at a second voltage or ground. The level shifter may include a second transistor stack comprising at least four transistors arranged from the first voltage source to ground, including second and third transistors coupled with the bias voltage source, and a fourth transistor to receive an inverse of the input signal. A first transistor of the first transistor stack is cross-coupled with a first transistor of the second transistor stack. A level shifter may include a first output coupled with the second transistor stack between the second and third transistors to provide a first output signal at the first voltage or ground.

15 Claims, 8 Drawing Sheets

(56)　　　　　　References Cited

U.S. PATENT DOCUMENTS

| 2015/0097612 | A1* | 4/2015 | Chuang | ........... | H03K 3/356182 |
| | | | | | 327/333 |
| 2022/0368319 | A1* | 11/2022 | Lu | ........................ | H03K 17/102 |
| 2023/0006660 | A1* | 1/2023 | Tsai | ..................... | H03K 3/0375 |

\* cited by examiner

Programmable IC 102

Processing System 140

Programmable Logic 110

Logic Cells 112

Support Circuits 114

Programmable Interconnect 116

Configuration Logic 120

Configuration Memory 130

Nonvolatile Memory 104

RAM 106

Other Circuits 108

100 out2=(Vbias, VddH)

out1=(Gnd, VddH)

Vinb=(VddL, Gnd)

VddH

VddH

Vbias

Gnd

Gnd

415

420

425

430

405   410

Vin=(Gnd, VddL)

400

VddH

Bias Voltage
Generation
Circuit

Vbias

Gnd

435

THIN OXIDE LOW VOLTAGE TO HIGH VOLTAGE LEVEL SHIFTERS

TECHNICAL FIELD

Examples of the present disclosure generally relate to thin oxide low voltage to high voltage level shifter apparatuses and methods, for example low power, high voltage based, robust thin oxide low voltage to high voltage level shifters.

BACKGROUND

Level shifters are important components of many integrated circuits, as they enable the communication between components that operate at different voltage levels, ensuring the correct functioning of the system of the integrated circuit as a whole. A level shifter is an integrated circuit component that is used to shift the voltage level of a signal from one level to another. One purpose of a level shifter is to enable the communication between two circuits that operate at different voltage levels. In an integrated circuit, different blocks or circuits may operate at different voltage levels depending on their design. For example, one circuit (e.g., including a microcontroller) might operate at 3.3 volts, while a second circuit (e.g., including a sensor) might operate at 1.8 volts. When these components need to communicate with each other, a level shifter is used to ensure that the signal levels are compatible.

A level shifter can shift a signal up or down, depending on the requirements of the system. Level shifters typically can be implemented using a variety of techniques, including resistor dividers, capacitive coupling, or transistor-based circuits. The specific design of a level shifter can depend on factors such as the voltage levels involved, the required speed and power consumption, and the noise immunity of the system.

Modern semiconductor devices may feature transistors having relatively thin gate oxide layers, for example for the bulk of the logic of the semiconductor device. Such transistors have limits on the voltage that can be applied across the gate oxide, for example between the gate and source ($V_{gs}$). Current level shifter designs (e.g. for shifting from low voltage to higher voltage require a voltage to be applied across the gate oxide that violates the limits for the relatively thin gate oxide layers for these transistors. As such, transistors having relatively thicker gate oxide layers are used for the level shifters, even though the bulk of the transistors use relatively thinner gate oxide layers. These additional transistors typically require one or more separate masks, increasing processing cost and time. As such, level shifter devices that can use the same transistors (e.g., the transistors having the relatively thin gate oxide layers) as the remaining logic of the semiconductor device are desired.

SUMMARY

Some examples described herein provide for thin oxide low voltage to high voltage level shifter apparatuses and methods, for example low power, high voltage based, robust thin oxide low voltage to high voltage level shifters.

An example of the present disclosure is a level shifter. The level shifter includes a first transistor stack including at least four transistors arranged from a source of a first voltage to a ground, including a second transistor and a third transistor coupled with a source of a bias voltage, and a fourth transistor coupled with an input of the level shifter, the input to receive an input signal at a second voltage or the ground, the second voltage less than the first voltage. The level shifter further includes a second transistor stack including at least four transistors arranged from the source of the first voltage to the ground, including a second transistor and a third transistor coupled with the source of the bias voltage, and a fourth transistor coupled with an inverse input associated with the input and to receive an inverse of the input signal, wherein a first transistor of the first transistor stack is cross-coupled with a first transistor of the second transistor stack. The level shifter further includes a first output coupled with the second transistor stack between the second transistor and the third transistor to provide a first output signal at the first voltage or the ground.

Another example of the present disclosure is a level shifter. The level shifter includes a first transistor stack including a first pullup transistor coupled with a source of a first voltage, a second pullup transistor, a first pulldown transistor, and a second pulldown transistor coupled with a ground. The level shifter further includes a second transistor stack including a third pullup transistor coupled with the source of the first voltage, a fourth pullup transistor, a third pulldown transistor, and a fourth pulldown transistor coupled with the ground. The level shifter further includes an inverter having an input coupled with a signal input to the level shifter; and wherein the source of the first voltage is associated with a first output of the level shifter and is greater than a second voltage associated with an input of the level shifter wherein the first pullup transistor and the third pullup transistor are cross-coupled. Each gate of the second pullup transistor, the first pulldown transistor, the third pullup transistor, and the third pulldown transistor are coupled with a source of a bias voltage. A gate of the second pulldown transistor is coupled with an input to receive an input signal for the level shifter. A gate of the fourth pulldown transistor is coupled with an output of the inverter.

Another example of the present disclosure is an apparatus. The apparatus includes a first set of cross-coupled pullup transistors each having a source that is coupled with a source of a first voltage. The apparatus further includes a second set of pullup transistors each having a gate coupled with a source of a bias voltage that is less than the first voltage, and a source that is coupled with a drain of a respective pullup transistor of the first set of cross-coupled pullup transistors. The apparatus further includes a first set of pulldown transistors each having a gate coupled with the source of the bias voltage, and a drain that is coupled with a drain of a respective pullup transistor of the second set of pullup transistors. The apparatus further includes a second set of pulldown transistors each having a drain that is coupled with a source of a respective pulldown transistor of the first set of pulldown transistors, and a source coupled with a ground. A gate of a first pulldown transistor of the second set of pulldown transistors is configured to receive an input signal at a second voltage or the ground. The second voltage less than the first voltage. A first output at the drain of one of the pullup transistors of the second set of pullup transistors is to provide a first output signal at the first voltage or the ground.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
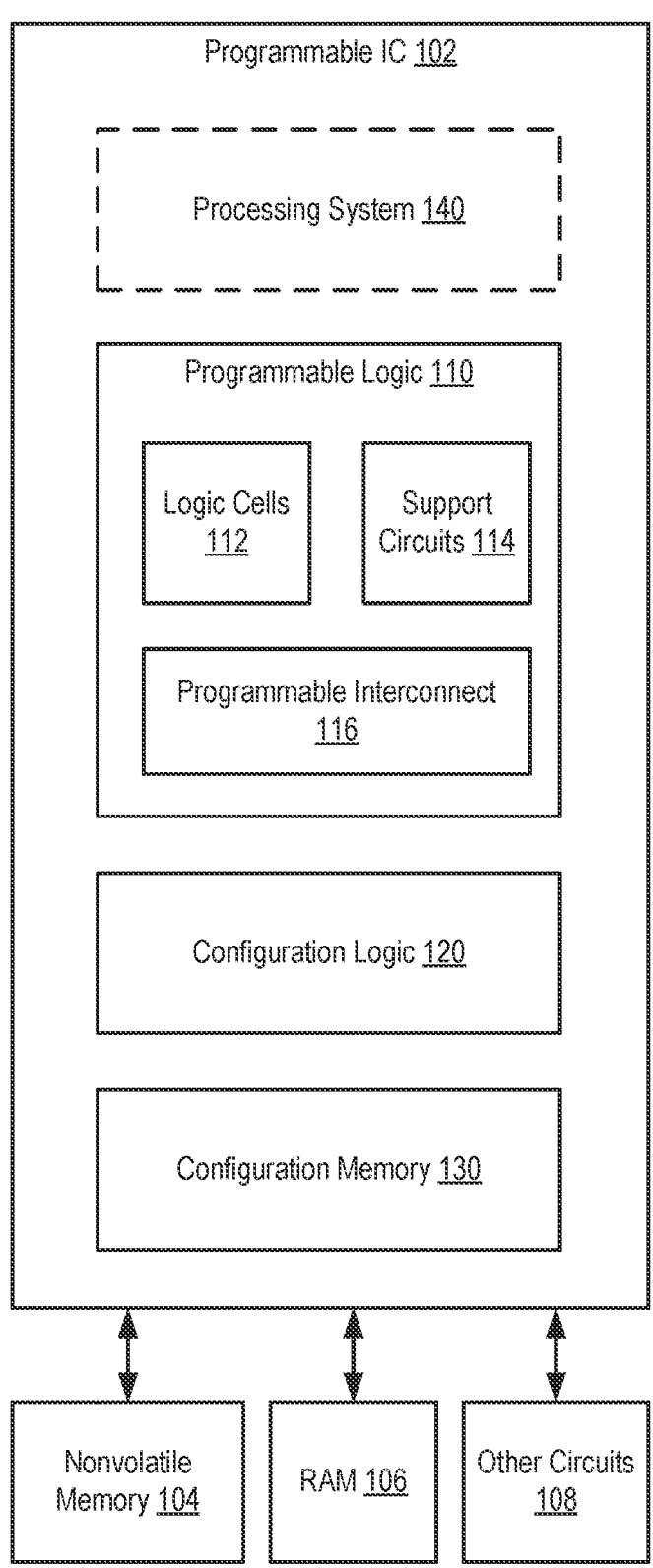
FIG. 1 is a block diagram depicting a computing system that includes a programmable integrated circuit (IC) according to an example.
Figure 1:

Some examples described herein provide for thin oxide low voltage to high voltage level shifter apparatuses and methods, for example low power, high voltage based, robust thin oxide low voltage to high-voltage level shifters.

A level shifter apparatus is described. In one or more embodiments, the level shifter utilizes metal oxide semiconductor field effect transistors (MOSFETs), such as MOSFETs utilizing a relatively thin gate oxide. In one or more embodiments, the level shifter shifts a voltage level for a signal to a higher level (e.g., a first voltage) from a lower level (e.g., a second voltage). The level shifter includes at least two sets of stacked transistors (e.g., mirrored stacks of at transistors). The two sets of stacked transistors include a first set of cross-coupled pullup (e.g., p-type MOSFETs (PMOS)) transistors each coupled with the first voltage source. The sets of stacked transistors further include a second set of pullup transistors (e.g., PMOS) and a first set of pulldown (e.g., n-type MOSFETs (NMOS)) transistors, each having a gate coupled with a source of a bias voltage that is less than the first voltage. The source of each respective transistor of the second set of pullup transistors is coupled with the drain of a corresponding transistor of the first set of pullup transistors that are cross-coupled. A second set of pulldown transistors (e.g., NMOS) are coupled from the first set of pulldown transistors to ground. The level shifter receives (obtains) an input signal at the gate of a pulldown transistor (e.g., of the first set of stacked transistors) of the second set of pulldown transistors at the second voltage level (or ground). The level shifter outputs (transmits, provides) a first output signal from the drain of one of the pullup transistors of the second set of pullup transistors (of the first set of stacked transistors) to provide a first output signal at the first voltage level (or ground).

In one or more embodiments, overvoltage limitations are reduced. For example, one or more embodiments reduce or eliminate overvoltage conditions between transistor nodes of a thin-oxide level shifter when operating at 1.35 V to 1.65 V. In one or more embodiments, power-down overvoltage and contention issues are reduced or eliminated.

In one or more embodiments, the level shifter also outputs (transmits, provides) a second output signal from the drain of one of the pullup transistors (e.g., of the second set of stacked transistors) of the first set of pullup transistors to provide a first output signal at the bias voltage level (or the first voltage level). In one or more embodiments, the level shifter also outputs (transmits, provides) a third output signal from the source of one of the pulldown transistors (e.g., of the second set of stacked transistors) of the first set of pulldown transistors to provide a third output signal at ground (or the bias voltage level).

In one or more embodiments, voltage level shifting is provided to different ranges (0, VddH), (Vbias, VddH) & (0, Vbias) respectively, where 0 is a ground voltage level, VddH is a relatively higher voltage (e.g., than VddL) to which an input signal is being shifted, and Vbias is a bias voltage. In some examples, VddL is input voltage (e.g., 0.65 V to 0.91 V), VddH is the Level Shifter Supply Voltage (e.g., 1.35 V to 1.65 V), and Vbias is less than VddH (e.g., about VddH/2). In some exemplary applications of embodiments, the multiple voltages (e.g., VddH, Vbias, 0) can be used as select signals for a mux depending on the input voltages. In another exemplary applications of embodiments, the multiple voltages (e.g., VddH, Vbias, 0) can control pullup and/or pulldown controls, or to control other operations, four different thin-oxide level shifters are proposed.

In one or more embodiments, a layout area is reduced and/or power consumption reduced by using thin-oxide transistors. The described one or more embodiment may be used to relatively higher voltages, (e.g., 3.3 V input/output designs) by extending the concepts described herein with minor design modifications.

In one or more embodiments, diode connected transistors (e.g., pullup, PMOS) are coupled to a first node at the drain of the pullup transistors of the first set of pullup transistors (e.g., the cross coupled pullup transistors) to prevent a floating node (e.g., for a second output to provide an output signal at the first voltage or the bias voltage). An advantage of such approach is to increase the stability at the output nodes, reduce leakage current, and reduce or prevent an overvoltage condition.

In one or more embodiments, a stack of diode connected transistors (e.g., pullup, PMOS) are coupled to each node between transistors of the stacked transistors. An advantage of such approach is to increase the stability of outputs across the output nodes.

In one or more embodiments, pullup transistors are each arranged with a source at the bias voltage, a drain at the first node, and a gate that is tied to (coupled with) the first output. An advantage of such approach is to increase stability at the first node (e.g., a second output) and the first output.

In one or more embodiments, additional cross-coupled pullup transistors are coupled with the source of each transistor of the third set. In some embodiments, all nodes of the first and second transistor stacks are tied to one of the bias voltage source, the first voltage source, or a ground. An advantage of such approach is to increase stability at the first node (e.g., a second output) and reduce or eliminate instances.

In one or more embodiments described herein, transistors (e.g., MOSFETs, including PMOS and NMOS) of the level shifter use a thin-oxide gate structure. The use of thin-oxide devices (e.g., transistors) may be targeted for 2 nm process technologies, and beyond, where the thin-oxide devices can replace thick-oxide devices, which may reduce the mask cost. In some embodiments, the thin-oxide gate structure is also used by other (e.g., remaining) transistors of a semiconductor device that utilizes the level shifter. In one or more embodiments, the level shifter or both the level shifter and the semiconductor device omit any thick-oxide transistors. In some embodiments, a thin-oxide gate and a thick-oxide gate for a particular process technology are defined relative to a process technology used to manufacture the semiconductor device. For example, the thin-oxide transistor device has a relatively thinner (less thick) gate oxide than a thick-oxide transistor device. In one or more embodiments, a thin-oxide transistor device has a gate oxide thickness of less than 1 nm, and a thick-oxide transistor device has a gate oxide thickness of at least 1 nm. In one or more embodiments, a thick-oxide transistor device has a gate oxide thickness that is at least twice as thick as a thin-oxide transistor device associated with a same process technology (e.g., same process node size) and material. In some embodiments, the semiconductor device (including the level shifter) has only thin-oxide transistor devices.

In one or more embodiments, the term thin-oxide (thin-ox) includes those devices that work (e.g., have a useful operate range) with 0.65V-0.9V (e.g., typically 0.75V) supply voltage, and the term thick-oxide (thick-ox) includes those devices that work (e.g., have a useful operate range) with 1.35V-1.65V (e.g., typically 1.5V) supply voltage. Both thin-ox & thick-ox devices are typically available in 3 nm technology, exemplary features and parameters of which follow:

TABLE 1

| Exemplary thick-ox and thin-ox features and parameters. | |
| --- | --- |
| Thick-ox devices in 3 nm technology | Thin-ox devices in 3 nm technology |
| These devices may also be or be called IO devices | These devices may also be or be called core devices |
| The operating voltage of these devices is 1.35 V-1.65 V [Typical voltage = 1.5 V] | The operating voltage of these devices is 0.65 V-0.9 V [Typical voltage = 0.75 V] |
| These devices are not available beyond 2 nm onwards (less than 2 nm) | These are the only devices available beyond 2 nm onwards (less than 2 nm) |
| The oxide thickness is more with different voltage spacing rules | The oxide thickness is less with different voltage spacing rules |

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

Aspects of the disclosure are initially described in the context of an exemplary computing system in which embodiments may be implemented. Aspects of the disclosure are further illustrated by and described with reference to apparatus diagrams that relate to level shifters utilizing thin-oxide transistor devices.

FIG. 1 is a block diagram depicting a computing system 100 that includes a programmable integrated circuit (IC) 102 according to an example. The programmable IC 102 includes programmable logic 110, configuration logic 120, and configuration memory 130. The programmable IC 102 can be coupled to external circuits, such as the nonvolatile memory (NVM) 104, the random access memory (RAM) 106, and other circuits 108. In some examples, RAM 106 may be dynamic random-access memory (DRAM).

In some aspects, the techniques described herein relate to a level shifter, including: a first transistor stack including at least four transistors arranged from a source of a first voltage to a ground, including a second transistor and a third transistor coupled with a source of a bias voltage, and a fourth transistor coupled with an input of the level shifter, the input to receive an input signal at a second voltage or the ground, the second voltage less than the first voltage; a second transistor stack including at least four transistors arranged from the source of the first voltage to the ground, including a second transistor and a third transistor coupled with the source of the bias voltage, and a fourth transistor coupled with an inverse input associated with the input and to receive an inverse of the input signal, wherein a first transistor of the first transistor stack is cross-coupled with a first transistor of the second transistor stack; and a first output coupled with the second transistor stack between the second transistor and the third transistor to provide a first output signal at the first voltage or the ground.

The programmable logic 110 includes logic cells 112, support circuits 114, and programmable interconnect 116. The logic cells 112 include circuits that can be configured to implement general logic functions of a plurality of inputs. The support circuits 114 include dedicated circuits, such as transceivers, input/output blocks, digital signal processors, memories, and the like. The logic cells 112 and the support circuits 114 can be interconnected using the programmable interconnect 116. Information for programming the logic cells 110, for setting parameters of the support circuits 114, and for programming the programmable interconnect 116 is stored in the configuration memory 130 by the configuration logic 120. The configuration logic 120 can obtain the configuration data from the nonvolatile memory 104 or any other source (e.g., the RAM 106 or from the other circuits 108).

In some examples, the programmable IC 102 is a part of a computing system and is communicatively coupled with a processing system (not shown) of the computing system that is external to the programmable IC 102. The external processing system can include microprocessor(s), memory, support circuits, input/output (I/O) circuits, and the like. In other examples, the processing system 140 can be used in place of at least some of the external processing system for the computing system. The programmable IC 102 can be part of the computing system, and the programmable IC 102 can include the processing system 140 as part of the programmable IC 102, such that the programmable IC 102 includes one or more of the microprocessor(s), memory, support circuits, I/O circuits, and the like. In some example, the entire computing system can be implemented using the programmable IC 102.

Figure 2:
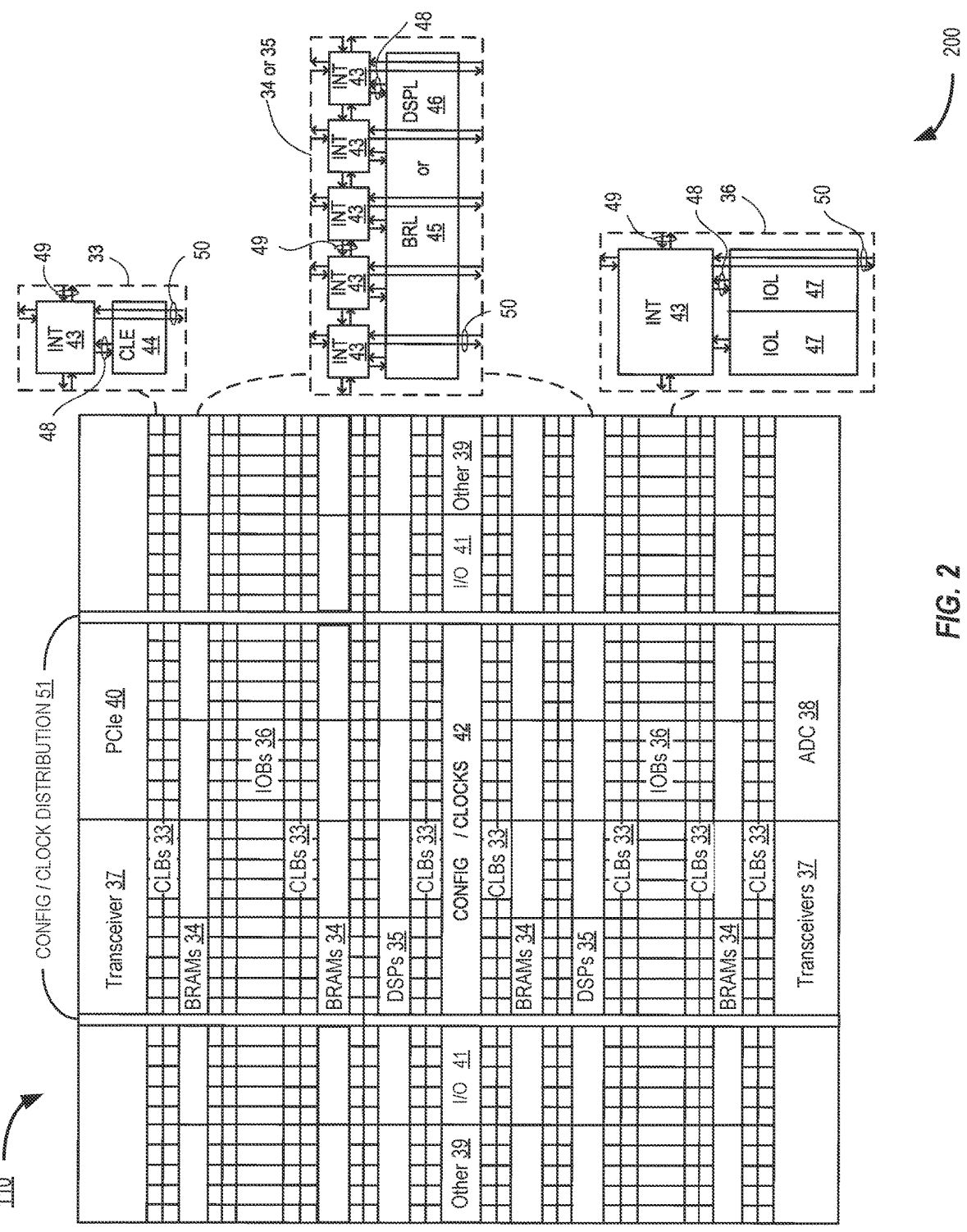
FIG. 2 illustrates a field programmable gate array (FPGA) implementation 200 of the programmable IC according to some examples.

FIG. 2 illustrates a field programmable gate array (FPGA) implementation 200 of the programmable IC 102 according to some examples. In one or more examples, the programmable IC 102 that includes a large number of different programmable tiles including transceivers 37, configurable logic blocks (CLBs) 33, block random access memories (BRAMs) 34, input/output blocks ("IOBs") 36, configuration and clocking logic ("CONFIG/CLOCKS") 42, digital signal processor (DSP) blocks 35, specialized input/output blocks ("I/O") 41 (e.g., configuration ports and clock ports), and other programmable logic 39 such as digital clock managers, analog-to-digital converters, system monitoring logic, and so forth. The FPGA can also include peripheral component interconnect (PCI) express (PCIe) interfaces 40, analog-to-digital converters (ADCs) 38, and the like.

In some FPGAs, each programmable tile can include at least one programmable interconnect element ("INT") 43 having connections to input and output terminals 48 of a programmable logic element within the same tile, as shown by examples included at the top of FIG. 2. Each programmable interconnect element 43 can also include connections to interconnect segments 49 of adjacent programmable interconnect element(s) in the same tile or other tile(s). Each programmable interconnect element 43 can also include connections to interconnect segments 50 of general routing resources between logic blocks (not shown). The general routing resources can include routing channels between logic blocks (not shown) comprising tracks of interconnect segments (e.g., interconnect segments 50) and switch blocks (not shown) for connecting interconnect segments. The interconnect segments of the general routing resources (e.g., interconnect segments 50) can span one or more logic blocks. The programmable interconnect elements 43 taken together with the general routing resources implement a programmable interconnect structure ("programmable interconnect") for the illustrated FPGA.

In an example implementation, a CLB 33 can include a configurable logic element ("CLE") 44 that can be programmed to implement user logic plus a single INT 43. A BRAM 34 can include a BRAM logic element ("BRL") 45 in addition to one or more programmable interconnect elements. Typically, the number of interconnect elements included in a tile depends on the height of the tile. In the pictured example, a BRAM tile has the same height as five CLBs, but other numbers (e.g., four) can also be used. A DSP tile 35 can include a DSP logic element ("DSPL") 46 in addition to an appropriate number of programmable interconnect elements. An IOB 36 can include, for example, two instances of an input/output logic element ("IOL") 47 in addition to one instance of the programmable interconnect element 43. As will be clear to those of skill in the art, the actual I/O pads connected, for example, to the I/O logic element 47 typically are not confined to the area of the input/output logic element 47.

In the pictured example of the FPGA implementation 200, a horizontal area near the center of the die is used for configuration, clock, and other control logic. Vertical columns 51 extending from this horizontal area or column are used to distribute the clocks and configuration signals across the breadth of the FPGA implementation 200.

Some examples of FPGAs utilizing the architecture illustrated by the FPGA implementation 200 include additional logic blocks that disrupt the regular columnar structure of the FPGA implementation 200. The additional logic blocks can be programmable blocks and/or dedicated logic.

Note that the FPGA implementation 200 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of the illustrated FPGA implementation 200 are purely exemplary. For example, in an actual implementation of an FPGA, more than one adjacent row of CLBs is typically included where the CLBs appear, to facilitate the efficient implementation of user logic, but the number of adjacent CLB rows can vary with the overall size of the FPGA.

Figure 3:
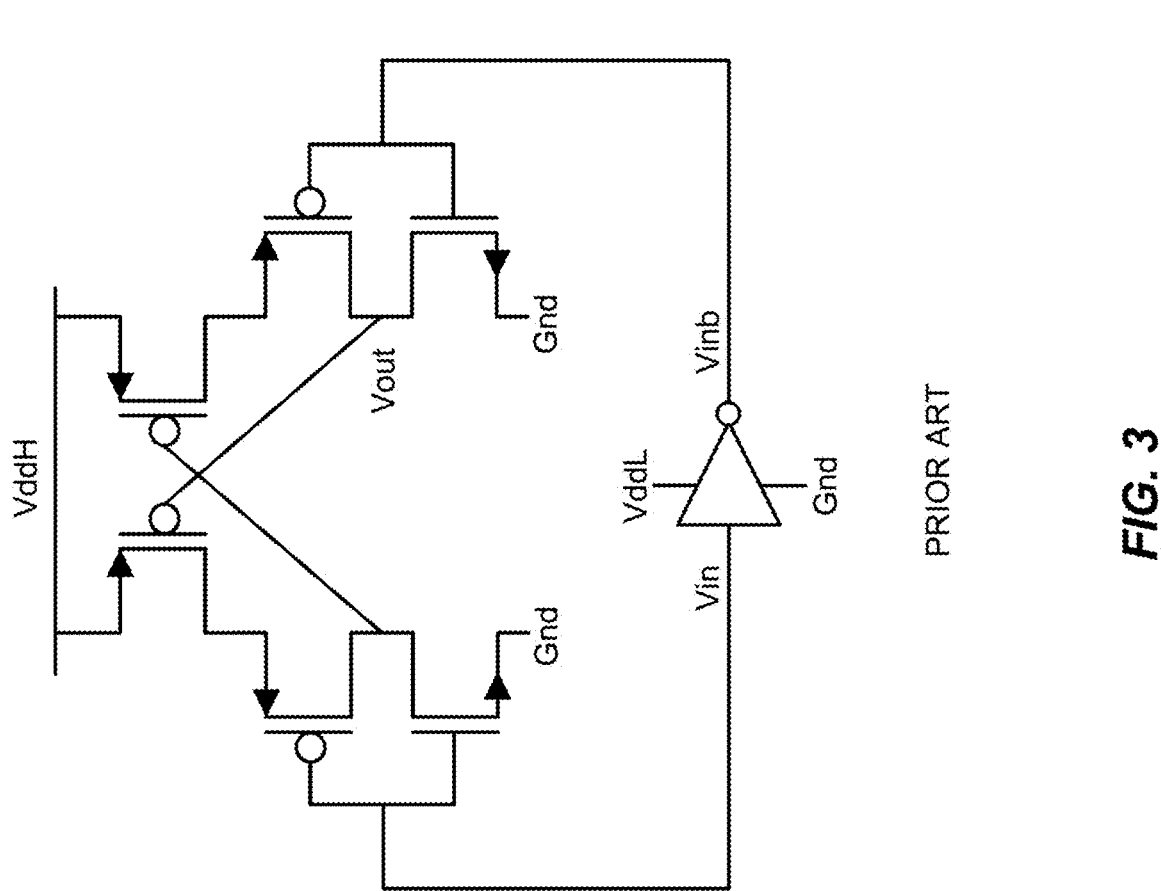
FIG. 3 is a circuit diagram of an exemplary level shifter that utilizes thick-oxide transistors.

FIG. 3 is a circuit diagram of an exemplary level shifter 300 that utilizes thick-oxide transistors. Vin is an input signal to the level shifter 300 that operates from VddL to ground, where Vin is to be shifted to an output signal Vout that operates from VddH to ground (Gnd). For level shifter 300, all MOSFETs with the VddH power supply are thick-oxide devices, and the inverter with VddL power supply for Vin (to generate Vinb) may include MOSFETs that are thin-oxide devices. An exemplary or typical value for VddL can be 0.7 V, and for VddH can be 1.5 V. As a result of such values, the overvoltage limit across any two nodes is VddH. In the example of level shifter 300, NMOS body is connected to ground, and PMOS body is connected to VddH.

Figure 4:
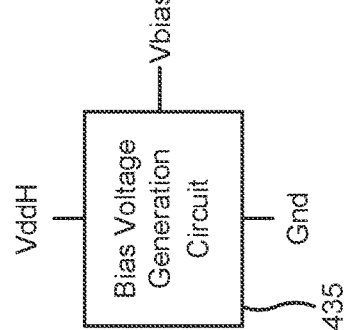
FIG. 4 is a circuit diagram of a level shifter that utilizes thin-oxide transistors, according to one or more embodiments described herein.

FIG. 4 is a circuit diagram of a level shifter 400 that utilizes thin-oxide transistors, according to one or more embodiments described herein. In one or more embodiments, the thin-oxide transistors of level shifter 400 are MOSFETs, including PMOS transistors (which may also be referred to as pullups or pullup transistors herein) and NMOS transistors (which may also be referred to as pulldowns or pulldown transistors herein).

In one or more embodiments, level shifter 400 includes at least two transistor stacks, including a first transistor stack 405 and a second transistor stack 410 arranged from VddH to Gnd. The first transistor stack 405 includes at least four transistors, including two PMOS and two NMOS. The second transistor stack 410 includes at least four transistors, including two PMOS and two NMOS that generally mirror corresponding PMOS and NMOS of the first transistor stack 405.

Level shifter 400 includes a first set of cross-coupled pullup transistors 415 (e.g., two PMOS). Each transistor (one PMOS associated with the first transistor stack 405 and one PMOS associated with the second transistor stack 410) has a source that is coupled with a source of a first voltage (e.g., VddH). A gate of a first pullup transistor of the first transistor stack 405 is connected to the drain of a second pullup of the second transistor stack 410. A gate of the second pullup transistor of the second transistor stack 410 is connected to the drain of the first pullup of the first transistor stack 405.

Level shifter 400 further includes a second set of pullup transistors 420 (e.g., two PMOS). Each transistor has a gate that coupled with a bias voltage generation circuit 435 that generates a bias voltage, Vbias, that is less than the first voltage (e.g., less than VddH, such as half or about half of VddH). A source of a first pullup transistor of the second set of pullup transistors 420 is connected to the drain of a first pullup transistor of the first set of cross-coupled pullup transistors 415 of the first transistor stack 405. A source of a second pullup transistor of the second set of pullup transistors 420 is connected to the drain of a second pullup of the second set of cross-coupled pullup transistors 415 of the second transistor stack 410.

Level shifter 400 further includes a first set of pulldown transistors 425 (e.g., two NMOS). Each transistor has a gate that coupled with the bias voltage generation circuit 435. A drain of a first pulldown transistor of the first set of pulldown transistors 425 is connected to the drain of a first pullup of the second set of pullup transistors 420 of the first transistor stack 405. A drain of a second pulldown transistor of the first set of pulldown transistors 425 is connected to the drain of a second pullup of the second set of pullup transistors 420 of the second transistor stack 410.

Level shifter 400 further includes a second set of pulldown transistors 430 (e.g., two NMOS). Each transistor has a source that is coupled with the ground. A drain of a first pulldown transistor of the second set of pulldown transistors 430 is connected to the source of a first pulldown of the first set of pulldown transistors 425 of the first transistor stack 405. A drain of a second pulldown transistor of the second set of pulldown transistors 430 is connected to the source of a second pulldown of the first set of pulldown transistors 425 of the second transistor stack 410.

A gate of the first pulldown transistor of the second set of pulldown transistors 430 is coupled with an input of the level shifter 400. The input voltage (Vin) is a signal from VddL to Gnd. A gate of the second pulldown transistor of the second set of pulldown transistors 430 is coupled with an inverted input of the level shifter 400. The inverted input voltage (Vinb) is a signal from Gnd to VddL.

A first output of the level shifter 400 is coupled with the second transistor stack 410 and is connected to the drain of the second pullup of the second set of pullup transistors 420 and the drain of the first pulldown of the second set of pulldown transistors 425. The first output voltage (out1) is a signal from Gnd to VddH (e.g., the output signal from the first output is at the first voltage or ground).

A second output of the level shifter 400 is coupled with the second transistor stack 410 and is connected to the source of the second pullup of the second set of pullup transistors 420 and the drain of the first pullup of the first set of pullup transistors 415. The second output voltage (out2) is a signal from Vbias to VddH (e.g., the output signal from the second output is at the first voltage or the bias voltage).

In one or more of the embodiments described herein (e.g., level shifters 400, 500, 600), diode connected transistors and/or MMOS stacks can be utilized to provide stable outputs of the level shifter. In one or more of the embodiments described herein (e.g., level shifters 400, 700, 800), PMOS (e.g., pullup transistors) can be utilized to provide drive current to the outputs of the level shifter. In one or more of the embodiments described herein (e.g., level shifters 400, 500, 600, 700, or 800), an overvoltage condition can be eliminated during a static condition. In one or more of the embodiments described herein (e.g., level shifters 400, 500, 600, 700, or 800), an overvoltage can be reduced or minimized (e.g., minimized to a level less than a threshold, such as within one or more reliability limits) during a switching condition.

Figure 5:
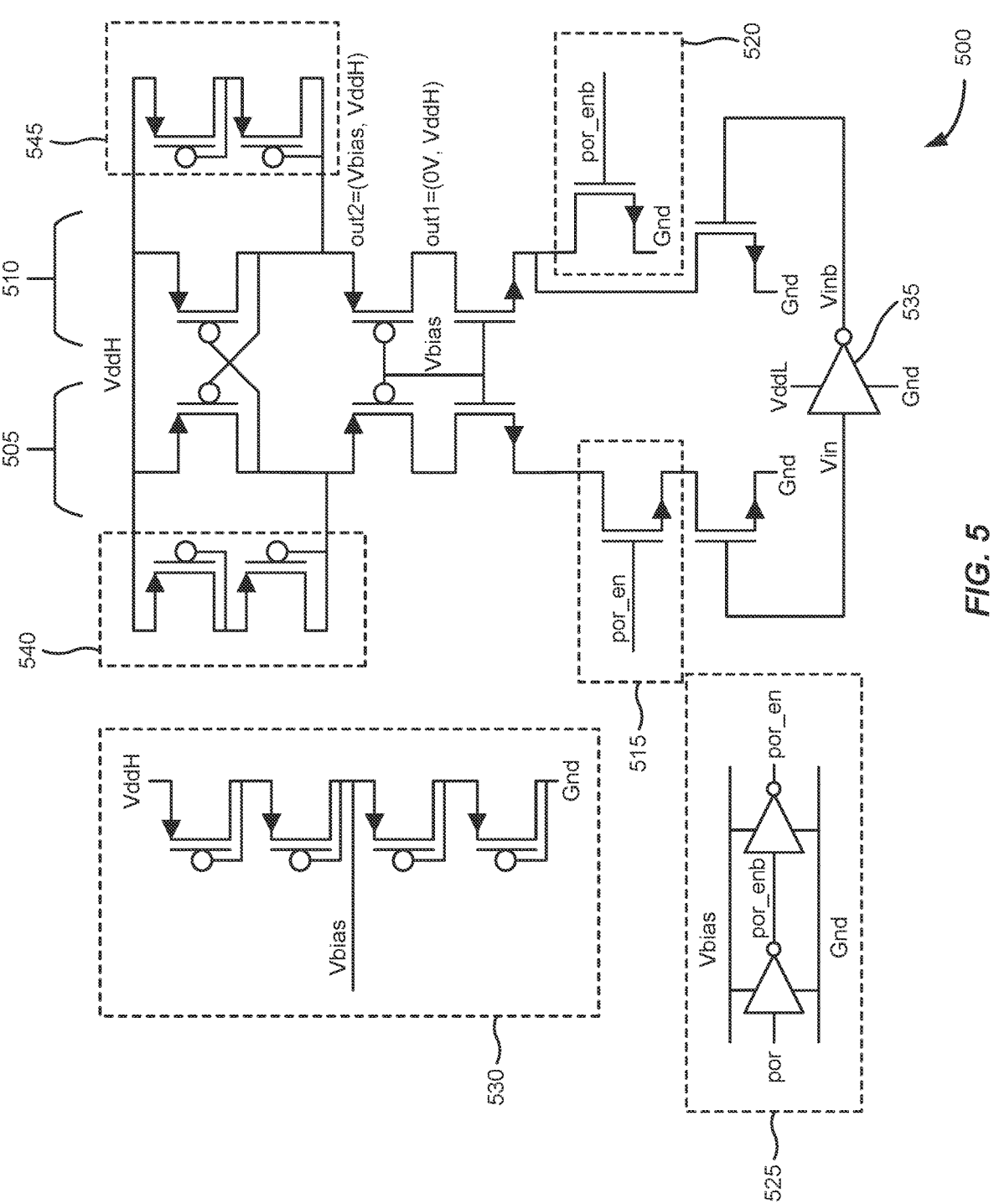
FIG. 5 is a circuit diagram of a level shifter that utilizes thin-oxide transistors, according to one or more embodiments described herein.

FIG. 5 is a circuit diagram of a level shifter 500 that utilizes thin-oxide transistors, according to one or more embodiments described herein. In one or more embodiments, the thin-oxide transistors of level shifter 500 are MOSFETs, including PMOS and NMOS transistors (pullup transistors or pulldown transistors).

Level shifter 500 includes a first transistor stack 505 and second transistor stack 510, which may be examples of first transistor stack 405 and second transistor stack 410. Additionally, level shifter 500 includes one or more of a first set of diode connected transistors 545, a second set of diode connected transistors 540, a first enable transistor 515, a second enable transistor 520, an enable signal generation circuit 525, a bias voltage source 530, and an inverter 535.

The first set of diode connected transistors 545 couple the source of the first voltage (VddH) to a first node between the first transistor (e.g., first PMOS pullup) of the second transistor stack 510 and the second transistor (e.g., second PMOS pullup) of the second transistor stack 510. The second output of the level shifter 500 is coupled with the second transistor stack 510 and is connected to the drain of the transistor of the first set of diode connected transistors 545 farthest from the source of the first voltage. The second output voltage (out2) is a signal from Gnd to VddH (e.g., the output signal from the first output is at the first voltage or ground).

The second set of diode connected transistors 540 couple the source of the first voltage (VddH) to a node between the first transistor (e.g., first PMOS pullup) of the first transistor stack 505 and the second transistor (e.g., second PMOS pullup) of the first transistor stack 505.

According to one or more embodiments, the first set of diode connected transistors 545, the second set of diode connected transistors 540, or both, can be used to substantially reduce or eliminate an overvoltage case. For example, the use of diode connected PMOS pullups (e.g., of the first set of diode connected transistors 545, the second set of diode connected transistors 540, or both) can prevent floating across the output terminals, including the second output (out2), the first output (out1), or both. In some embodiments, the output at the second output can be approximately Vbias-Vth or VddH rather than the desired Vbias or VddH for weak pullups. The use of strong pullups (e.g., pullups having a relatively large size, such as relative to pullups of the first transistor stack 405, or the second transistor stack 410, or both) can increase VddH leakage current. As such, the size of pullup transistors for the first set of diode connected transistors 545, the second set of diode connected transistors 540, or both can be designed to be balanced in the level shifter 500 to mitigate leakage and obtain the desired outputs of Vbias and/or VddH, for example Vbias and/or VddH within tolerances.

In one or more embodiments, the first enable transistor 515 is a NMOS inserted in series in the first transistor stack 505 that receives an enable signal (e.g., por_en). In one or more embodiments, the second enable transistor 520 inserted in series in the first transistor stack 505 is a NMOS that receives an inverse enable signal (e.g., por_enb). The enable signal generation circuit 525 generates the enable signal (e.g., por_en) and inverse enable signal (e.g., por_enb) from an input enable/disable signal (por) using the bias voltage (Vbias) as a power sources for the inverters of the enable signal generation circuit 525. The first enable transistor 515 and the second enable transistor 520 provide power down for the level shifter 500, saving power. Although NMOS are utilized in one or more embodiments, other transistor types and/or configurations are used in other embodiments.

In one or more embodiments, the first enable transistor 515, the second enable transistor 520, or both, are at least a portion of a power-down solution. When VddL=0 and VddH is high, the first output (out1) is pulled to 0V. Hence, where if Vin and Vinb are floating, the use of the enable transistors prevents contention, overvoltage, or both in the level shifter 500.

The bias voltage source 530 generates and/or provides the bias voltage. In one or more embodiments, the bias voltage source 530 includes a stack of four diode-connected PMOS having a source coupled with the VddH power supply and a drain coupled with the ground. Although four PMOS are utilized in one or more embodiments, other transistor types and/or quantities of PMOS are used in other embodiments.

The inverter 535 generates or provides the inverted input signal (e.g., Vinb) from the input signal (e.g., Vin) using the second voltage signal (e.g., VddL) as a power sources for the inverters of the 525.

Figure 6:
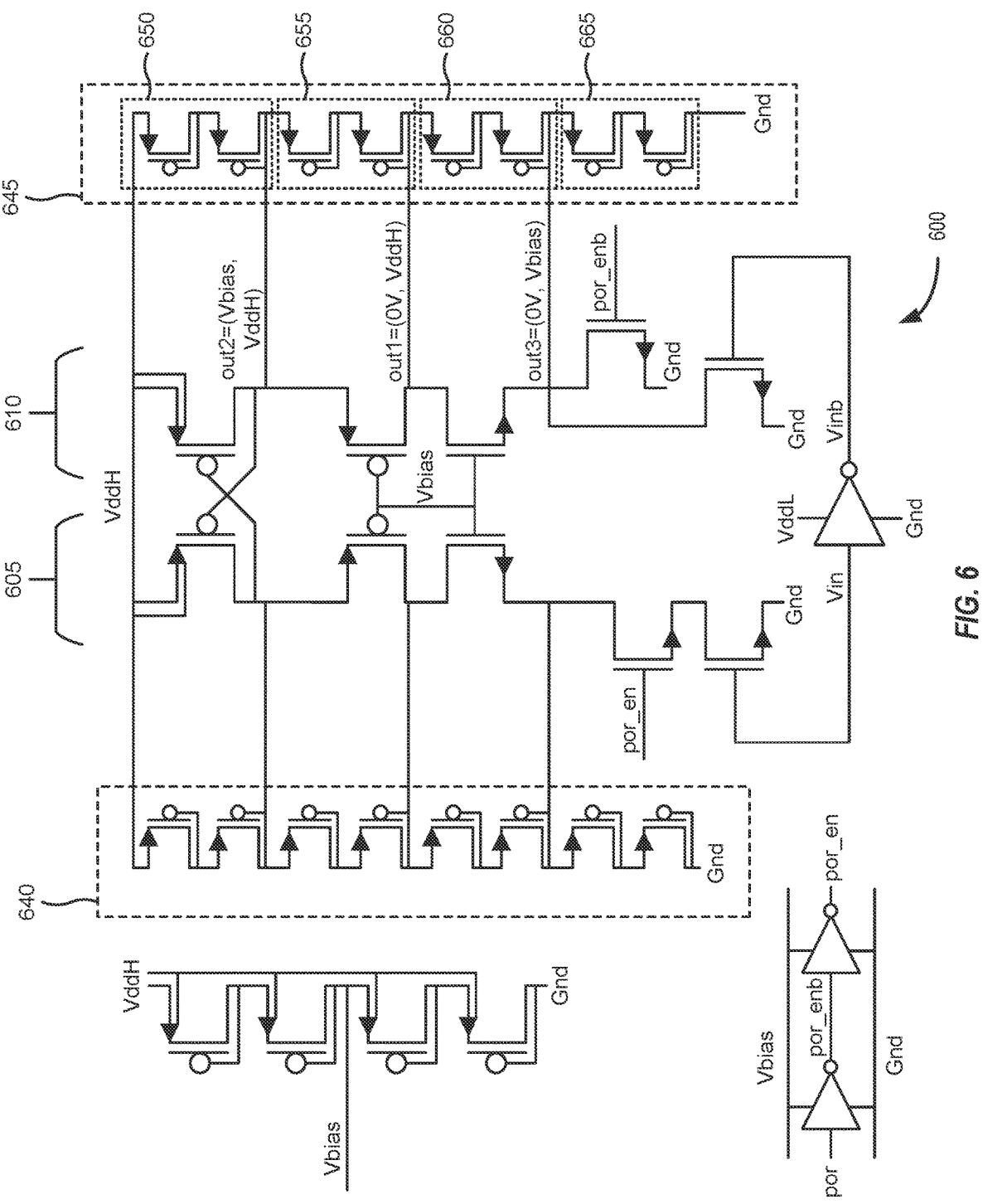
FIG. 6 is a circuit diagram of a level shifter that utilizes thin-oxide transistors, according to one or more embodiments described herein.

FIG. 6 is a circuit diagram of a level shifter 600 that utilizes thin-oxide transistors, according to one or more embodiments described herein. In one or more embodiments, the thin-oxide transistors of level shifter 600 are MOSFETs, including PMOS and NMOS transistors (pullup transistors or pulldown transistors).

Level shifter 600 includes a first transistor stack 605 and second transistor stack 610, which may be examples of first transistor stack 405 and second transistor stack 410, and one or more features previously discussed with reference to level shifter 500, level shifter 400, or both, including examples of a first enable transistor, a second enable transistor, an enable signal generation circuit, a bias voltage source, and an inverter.

Level shifter 600 also includes one or more of a first set of diode connected transistors 645 and a second set of diode connected transistors 640. The first set of diode connected transistors 645 includes a first set of diode connected transistors 650 coupling the source of the first voltage to a first node between the first transistor and the second transistor of the second transistor stack 610, a second set of diode connected transistors 655 coupling the first node to the first output, a third set of diode connected transistors 660 coupling the first output to a second node of the second transistor stack 610 between the third transistor and the fourth transistor, and a fourth set of diode connected transistors 665 coupling the second node to the ground. The second set of diode connected transistors 640 includes similar sets of transistors.

In one or more embodiments, the first set of diode connected transistors 645 (including the first set of diode connected transistors 650, the second set of diode connected transistors 655, the third set of diode connected transistors 660, and the fourth set of diode connected transistors 665), the second set of diode connected transistors 640, or both, are used to provide a stable output across all the output nodes (e.g., first output (out1), second output (out2), and third output (out3)). For example, these additional diodes provide a stable output with reduced response time at the outputs (e.g., out1, out2, out3), provide a mechanism to avoid or substantially mitigate floating node conditions, or both.

FIG. 6 is a circuit diagram of a level shifter 600 that utilizes thin-oxide transistors, according to one or more embodiments described herein. In one or more embodiments, the thin-oxide transistors of level shifter 600 are MOSFETs, including PMOS and NMOS transistors (pullup transistors or pulldown transistors).

Level shifter 600 includes a first transistor stack 605 and second transistor stack 610, which may be examples of first transistor stack 405 and second transistor stack 410, and one or more features previously discussed with reference to level shifter 500, level shifter 400, or both, including examples of a first enable transistor, a second enable transistor, an enable signal generation circuit, a bias voltage source, and an inverter.

Level shifter 600 also includes one or more of a first set of diode connected transistors 645 and a second set of diode connected transistors 640. The first set of diode connected transistors 645 includes a first set of diode connected transistors 650 coupling the source of the first voltage to a first node between the first transistor and the second transistor of the second transistor stack 610, a second set of diode connected transistors 655 coupling the first node to the first output, a third set of diode connected transistors 660 coupling the first output to a second node of the second transistor stack 610 between the third transistor and the fourth transistor, and a fourth set of diode connected transistors 665 coupling the second node to the ground. The second set of diode connected transistors 640 includes similar sets of transistors.

In one or more embodiments, the first set of diode connected transistors 645 (including the first set of diode connected transistors 650, the second set of diode connected transistors 655, the third set of diode connected transistors 660, and the fourth set of diode connected transistors 665), the second set of diode connected transistors 640, or both, are used to provide a stable output across all the output nodes (e.g., first output (out1), second output (out2), and third output (out3)). For example, these additional diodes provide a stable output with reduced response time at the outputs (e.g., out1, out2, out3), provide a mechanism to avoid, eliminate, or substantially mitigate floating node conditions, or both.

Figure 7:
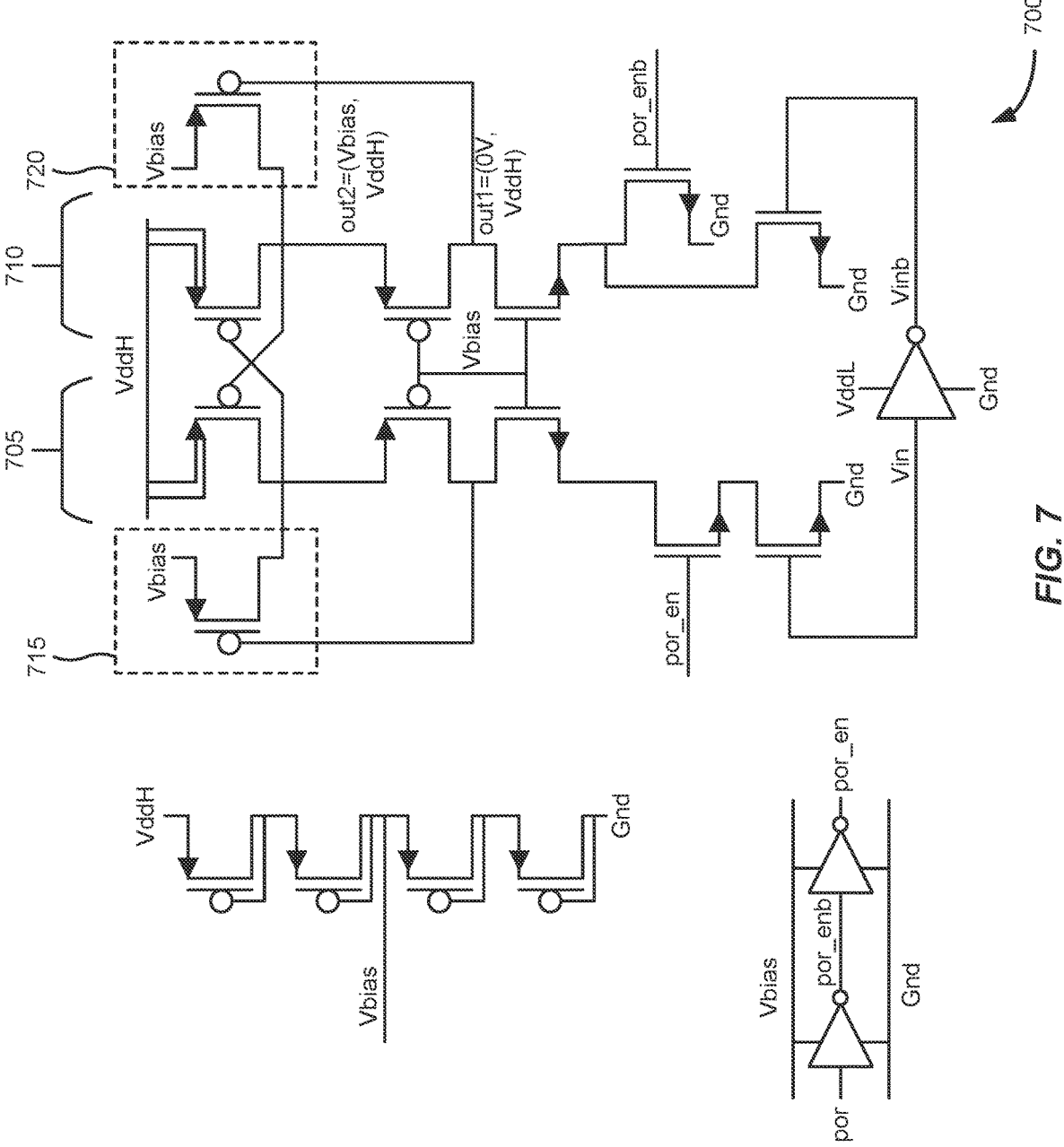
FIG. 7 is a circuit diagram of a level shifter that utilizes thin-oxide transistors, according to one or more embodiments described herein.

FIG. 7 is a circuit diagram of a level shifter 700 that utilizes thin-oxide transistors, according to one or more embodiments described herein. Level shifter 700 includes a first transistor stack 705 and second transistor stack 710, which may be examples of first transistor stack 405 and second transistor stack 410, and one or more features previously discussed with reference to level shifter 400, level shifter 500, level shifter 600, or both, including examples of a first enable transistor, a second enable transistor, an enable signal generation circuit, a bias voltage source, and an inverter.

Level shifter 700 has a first output (out1) coupled with the second transistor stack 710 between the second transistor of the second transistor stack 710 and the third transistor of the second transistor stack 710 to provide a first output signal at the first voltage (e.g., VddH) or the ground (e.g., 0V). Level shifter 700 has a second output (out2) coupled with the second transistor stack 710 between the first transistor of the second transistor stack 710 and the second transistor of the second transistor stack 710 to provide a first output signal at the first voltage (e.g., VddH) or the bias voltage (e.g., Vbias).

Level shifter 700 also includes one or more of a first pullup transistor 720 and a second pullup transistor 715. In one or more embodiments, the first pullup transistor 720 has a source coupled with the source of the bias voltage, a drain coupled with a first node between the first transistor of the second transistor stack 710 and the second transistor of the second transistor stack 710, and a gate coupled with the first output (out1).

A stable or substantially (approximately, about) stable output at out1, out2, or both, can be generated through the use of the first pullup transistor 720, second pullup transistor 715, or both. In one or more embodiments, the first pullup transistor 720, the second pullup transistor 715, or both, can each be or include more than one transistor (e.g., more than one pullup transistor), or be differently sized from other pullup transistors of the first transistor stack 705, the second transistor stack 710, or both. The size of pullup transistors for first pullup transistor 720, second pullup transistor 715, or both, can be designed to be balanced in the level shifter 700 to mitigate or eliminate overvoltage conditions (e.g., overvoltage within tolerances), for example at out1, out2, or both.

Figure 8:
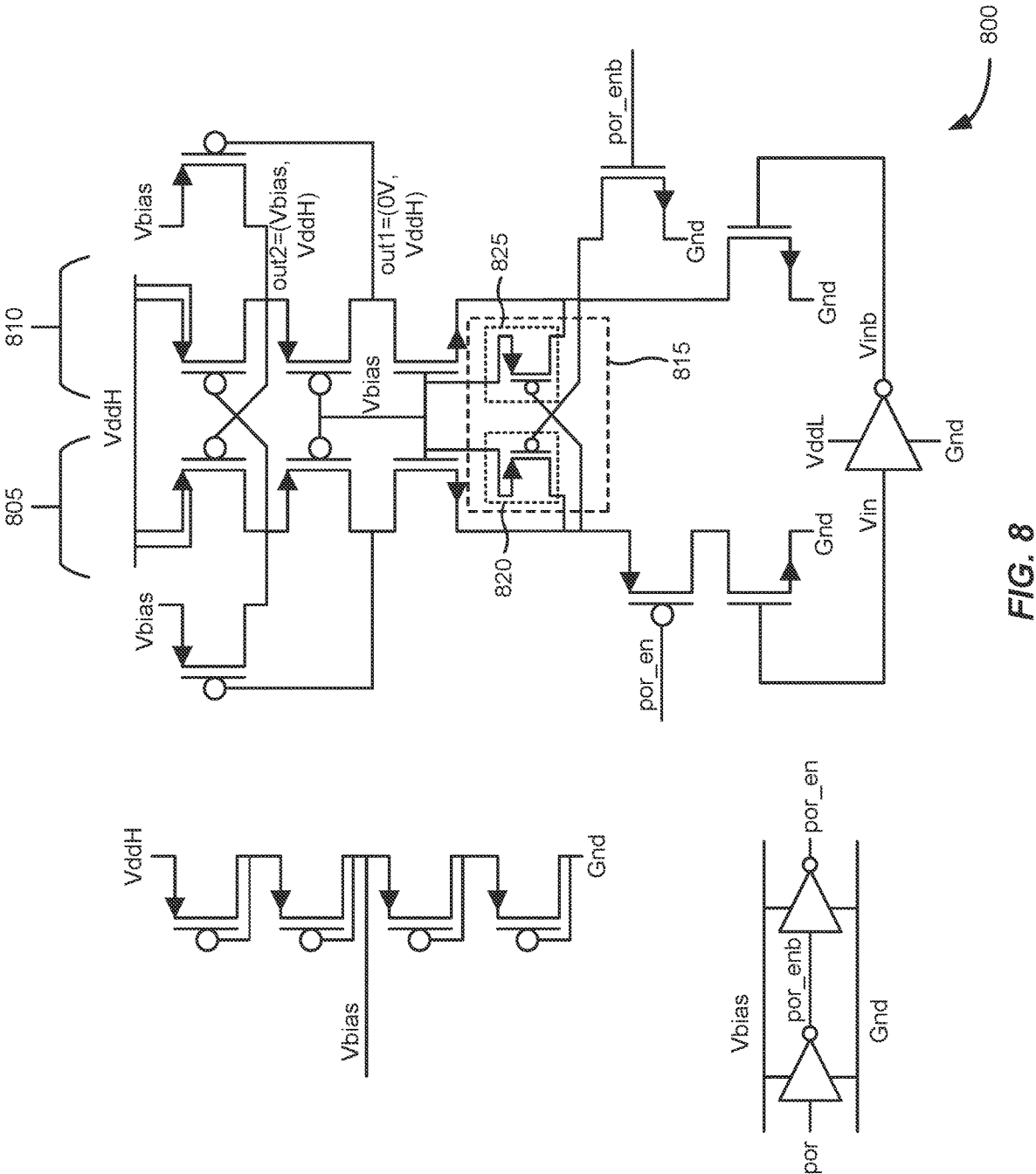
FIG. 8 is a circuit diagram of a level shifter that utilizes thin-oxide transistors, according to one or more embodiments described herein.

FIG. 8 is a circuit diagram of a level shifter 800 that utilizes thin-oxide transistors, according to one or more embodiments described herein. Level shifter 800 includes a first transistor stack 805 and second transistor stack 810, which may be examples of first transistor stack 405 and second transistor stack 410, and one or more features previously discussed with reference to level shifter 400, level shifter 500, level shifter 600, level shifter 700, or any combination thereof, including examples of a first enable transistor, a second enable transistor, an enable signal generation circuit, a bias voltage source, and an inverter. In one or more embodiments, level shifter 800 is substantially the same as level shifter 700, with the addition of a pair of cross-coupled pullup transistors 815.

Level shifter 800 has a first output (out1) coupled with the second transistor stack 810 between the second transistor of the second transistor stack 810 and the third transistor of the second transistor stack 810 to provide a first output signal at the first voltage (e.g., VddH) or the ground (e.g., 0V). Level shifter 800 has a second output (out2) coupled with the second transistor stack 810 between the first transistor of the second transistor stack 810 and the second transistor of the second transistor stack 810 to provide a first output signal at the first voltage (e.g., VddH) or the bias voltage (e.g., Vbias).

Level shifter 800 also includes one or more of a first pullup transistor 820 and a second pullup transistor 825. In one or more embodiments, the first pullup transistor 820 has a source coupled with the source of the bias voltage, a drain coupled with a source of the third transistor of the first transistor stack 805, a drain of the fourth transistor of the first transistor stack 805, and a gate coupled with the drain of the second pullup transistor 825. The second pullup transistor 825 has a source coupled with the source of the bias voltage, a drain coupled with a source of the third transistor of the second transistor stack 810, a drain of the fourth transistor of the second transistor stack 810, and a gate coupled with the drain of the first pullup transistor 820.

In one or more embodiments of the level shifter 800, all nodes of the first transistor stack 805 and second transistor stack 810 (e.g., including at least out1 and out2)) are tied to one of the bias voltage source, the first voltage source, or a ground. In some embodiment, no floating nodes are present in level shifter 800. An advantage of such approach is to increase stability at the nodes (e.g., a first output, a second output) and to avoid, eliminate, or substantially mitigate floating node conditions, or both. In some embodiments, the PMOS pullups are stacked to reduce current leakage.

In one or more embodiments, for example as described with reference to any of level shifters 400, 500, 600, 700, or 800, the following design specifications may be applied for one or more of VddL, VddH, Vbias, vgs, vds, vgd, vbg, vbs, vbd, out1, out2, or out3:

1. VddL=0.63 to 0.91V
2. VddH=1.35 to 1.65V
3. Vbias=VddH/2=0.675 to 0.825V.

Maximum voltage requirements for the thin-oxide transistor:
1. $|vgs|$, $|vds|$, $|vgd| <= 0.965$
2. $|vbg|$, $|vbs|$, $|vbd| <= 1.65V$ (e.g., bulk of a PMOS can be connected to VddH; bulk of a NMOS can be connected to gnd)

Output voltages:
out1=(0, VddH)
out2=(Vbias, VddH)
out3=(0, Vbias)

One or more embodiments as described above, for example as described with reference to any of level shifters 400, 500, 600, 700, or 800, may be applied in a select circuit. For example, multiple output ranges of the level shifter can be utilized to generate the select signal for a test multiplexor (mux) with input voltage ranging from 0 to VddH. The select signals are generated according to input voltage as shown in the following Table1:

TABLE 2

| Select signal voltage depending on input voltage range. | |
| --- | --- |
| Input | Select |
| 0 V | Out1 = (Vbias, VddH) |
| ~Vbias | Out2 = (0, VddH) |
| VddH | Out3 = (0, Vbias) |

One or more embodiments as described above, for example as described with reference to any of level shifters 400, 500, 600, 700, or 800, may be applied to provide signals to enable a particular functional block. In one or more examples, the level shifter may be used to generate an enable signal (e.g., En_p) for a PMOS (pullup) control and an enable signal (e.g., En_n) for a NMOS (pulldown) control to enable the block. For example, the pullup enable may be set to 0V for thick-oxide devices. In some examples, to prevent Vgs overvoltage we need (VddH-En_p)>0.965V for thin-oxide devices. Voltage ranges for the En_p, En_n control signals are shown in the following Table 2.

TABLE 2

| Pullup and Pulldown control voltage ranges. | |
| --- | --- |
| Enable | Voltage Range |
| En_p | Out1 = (Vbias, VddH) |
| En_n | Out2 = (0, Vbias) or |
| | Vin = (0, VddL) can also |
| | be used |

Note that the block associated with IP in the figure can be any other high voltage supporting circuit designed with thin-oxide or core devices.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A level shifter, comprising:
a first transistor stack comprising at least four transistors arranged from a source of a first voltage to a ground, including a second transistor and a third transistor coupled with a source of a bias voltage, and a fourth transistor coupled with an input of the level shifter, the input to receive an input signal at a second voltage or the ground, the second voltage less than the first voltage;
a second transistor stack comprising at least four transistors arranged from the source of the first voltage to the ground, including a second transistor and a third transistor coupled with the source of the bias voltage, and a fourth transistor coupled with an inverse input associated with the input and to receive an inverse of the input signal, wherein a first transistor of the first transistor stack is cross-coupled with a first transistor of the second transistor stack;
a first output coupled with the second transistor stack between the second transistor and the third transistor to provide a first output signal at the first voltage or the ground; and
a pullup transistor having a source coupled with the source of the bias voltage, a drain coupled with a first node between the first transistor and the second transistor of the second transistor stack, and a gate coupled with the first output.

2. The level shifter of claim 1, further comprising:
a pullup transistor having a source coupled with the source of the bias voltage, a drain coupled with a first node between the first transistor and the second transistor of the second transistor stack, and a gate coupled with the first output wherein the second voltage is between about 0.65 V and 0.91 V, and the first voltage is between about 1.35 V and 1.65 V.

3. The level shifter of claim 1, further comprising:
a first pullup transistor having a source coupled with the source of the bias voltage, and a drain coupled with a source of the third transistor of the first transistor stack; and
a second pullup transistor having a source coupled with the source of the bias voltage, and a drain coupled with a source of the third transistor of the second transistor stack, wherein a gate of the first pullup transistor is coupled with the drain of the second pullup transistor, and a gate of the second pullup transistor is coupled with the drain of the first pullup transistor wherein the bias voltage is supplied by a bias voltage source configured to generate approximately half of the first voltage.

4. The level shifter of claim 1, wherein each node of the first transistor stack and the second transistor stack are tied to the first voltage, the bias voltage, or the ground the transistors of the level shifter are thin-oxide transistors having a gate oxide thickness of less than 1 nanometer (nm).

5. The level shifter of claim 1, further comprising:
a set of diode-connected transistors arranged from the source of the first voltage to the ground to generate the bias voltage.

6. The level shifter of claim 1, further comprising:
a set of resistors arranged from the source of the first voltage to the ground te generate the bias voltage wherein each node of the first transistor stack and the second transistor stack is tied to one of the first voltage, the bias voltage or ground to prevent floating node conditions.

7. The level shifter of claim 1, further comprising:
a current mirror that generates the bias voltage wherein the level shifter is configured such that when the second voltage is 0 and the first voltage is high, the first output is pulled to ground to prevent contention.

8. The level shifter of claim 1, further comprising:
a first enable transistor in the first transistor stack between the third transistor and the fourth transistor; and
a second enable transistor coupled from a node between the third transistor and the fourth transistor of the second transistor stack to the ground.

9. The level shifter of claim 1, wherein all transistors of the level shifter have an oxide thickness no thicker than an oxide thickness for a plurality of logic transistors of a semiconductor device that includes the level shifter.

10. A level shifter, comprising:
a first transistor stack comprising a first pullup transistor coupled with a source of a first voltage, a second pullup transistor, a first pulldown transistor, and a second pulldown transistor coupled with a ground;
a second transistor stack comprising a third pullup transistor coupled with the source of the first voltage, a fourth pullup transistor, a third pulldown transistor, and a fourth pulldown transistor coupled with the ground; and
an inverter having an input coupled with a signal input to the level shifter, and a fifth pullup transistor having a source coupled with a source of a bias voltage, a drain coupled with a first node between the third pullup transistor and the fourth pullup transistor, and a gate coupled with a first output, wherein the source of the first voltage is associated with the first output of the level shifter and is greater than a second voltage associated with the signal input of to the level shifter wherein the first pullup transistor and the third pullup transistor are cross-coupled, wherein each gate of the second pullup transistor, the first pulldown transistor, the third pullup transistor, and the third pulldown transistor are coupled with a source of a bias voltage, a gate of the second pulldown transistor is coupled with an input to receive an input signal for the level shifter, a gate of the fourth pulldown transistor is coupled with an output of the inverter.

11. The level shifter of claim 10, further comprising:
a fifth pullup transistor having a source coupled with the source of the bias voltage, a drain coupled with a first node between the third pullup transistor and the fourth pullup transistor, and a gate coupled with the first output wherein the bias voltage is supplied by a bias voltage source configured to generate approximately half of the first voltage.

12. The level shifter of claim 10, further comprising:
a fifth pullup transister having a source coupled with the source of the bias voltage, and a drain coupled with a source of the first pulldown transistor; and
a sixth pullup transistor having a source coupled with the source of the bias voltage, and a drain coupled with a source of the third pulldown transistor, wherein a gate of the fifth pullup transistor is coupled with the drain of the sixth pullup transistor, and a gate of the sixth pullup transistor is coupled with the drain of the fifth pullup transistor wherein each node of the first transistor stack and the second transistor stack is tied to one of the first voltage, the bias voltage or ground to prevent floating node conditions.

13. An apparatus, comprising:

a first set of cross-coupled pullup transistors each having a source that is coupled with a source of a first voltage;

a second set of pullup transistors each having a gate coupled with a source of a bias voltage that is less than the first voltage, and a source that is coupled with a drain of a respective pullup transistor of the first set of cross-coupled pullup transistors;

a first set of pulldown transistors each having a gate coupled with the source of the bias voltage, and a drain that is coupled with a drain of a respective pullup transistor of the second set of pullup transistors;

a second set of pulldown transistors each having a drain that is coupled with a source of a respective pulldown transistor of the first set of pulldown transistors, and a source coupled with a ground, wherein a gate of a first pulldown transistor of the second set of pulldown transistors is configured to receive an input signal at a second voltage or the ground, the second voltage less than the first voltage; and a first output at the drain of one of the pullup transistors of the second set of pullup transistors to provide a first output signal at the first voltage or the ground; and a first pullup transistor having a source coupled with the source of the bias voltage, a drain coupled with a first node between a pullup transistor of the first set of cross-coupled pullup transistors and a pullup transistor of the second set of pullup transistors, and a gate coupled with the first output.

14. The apparatus of claim 13, further comprising:

a first pullup transistor having a source coupled with the source of the bias voltage, a drain coupled with a first node between a pullup transistor of the first set of cross-coupled pullup transistors and a pullup transistor of the second set of pullup transistors, and a gate coupled with the first output wherein the bias voltage is supplied by a bias voltage source configured to generate approximately half of the first voltage.

15. The apparatus of claim 13, further comprising:

a first pullup transistor having a source coupled with the source of the bias voltage, and a drain coupled with a source of a first pulldown transistor of the first set of pulldown transistors; and a second pullup transistor having a source coupled with the source of the bias voltage, and a drain coupled with a source of a second pulldown transistor of the first set of pulldown transistors, wherein a gate of the first pullup transistor is coupled with the drain of the second pullup transistor, and a gate of the second pullup transistor is coupled with the drain of the first pullup transistor wherein the level shifter is configured such that when the second voltage is 0 and the first voltage is high, the first output is pulled to ground to prevent contention.

\*   \*   \*   \*   \*